United States Patent
Chrysler et al.

(10) Patent No.: US 7,336,487 B1
(45) Date of Patent: Feb. 26, 2008

(54) COLD PLATE AND MATING MANIFOLD PLATE FOR IC DEVICE COOLING SYSTEM ENABLING THE SHIPMENT OF COOLING SYSTEM PRE-CHARGED WITH LIQUID COOLANT

(75) Inventors: Gregory M. Chrysler, Chandler, AZ (US); Paul J. Gwin, Orangevale, CA (US); David S. Chau, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/541,175

(22) Filed: Sep. 29, 2006

(51) Int. Cl.
H05K 7/20 (2006.01)

(52) U.S. Cl. .............. 361/699; 361/687; 361/689; 361/702; 257/714; 257/715; 257/E23.098; 165/104.33; 165/80.4; 165/80.2; 62/3.2; 62/259.2; 174/15.1

(58) Field of Classification Search ........... 361/687, 361/689, 699, 702; 165/104.33, 80.4, 80.2; 257/714, 715, E23.098; 62/3.2, 259.2; 174/15.1
See application file for complete search history.

(56) References Cited

U.S. PATENT DOCUMENTS

| 6,052,285 | A * | 4/2000 | Hileman ............... 361/699 |
| 6,549,407 | B1 | 4/2003 | Sauciuc et al. |
| 6,749,012 | B2 | 6/2004 | Gwin et al. |
| 6,809,928 | B2 | 10/2004 | Gwin et al. |
| 6,865,081 | B2 * | 3/2005 | Meyer et al. ............... 361/699 |
| 6,992,382 | B2 | 1/2006 | Chrysler et al. |
| 7,032,392 | B2 | 4/2006 | Koeneman et al. |
| 7,204,298 | B2 * | 4/2007 | Hodes et al. ............ 165/80.4 |
| 2002/0185260 | A1 * | 12/2002 | Calaman et al. .......... 165/80.4 |
| 2004/0109290 | A1 * | 6/2004 | Dunn et al. ............... 361/699 |

(Continued)

OTHER PUBLICATIONS

Pending, not yet published, U.S. Appl. No. 11/477,095, filed Jun. 27, 2006, to Sauciuc et al.

(Continued)

Primary Examiner—Boris Chervinsky
Assistant Examiner—Courtney Smith (57) ABSTRACT

Embodiments of a cold plate and a manifold plate are disclosed. The cold plate may be coupled with an integrated circuit die, and the cold plate may also include a flow path to receive a liquid coolant. Coolant moving through the flow path can remove heat generated by the die. The cold plate may include one or more piercing elements that are coupled with the flow path. The manifold plate may hold a volume of a liquid coolant, and one or more breakable seals on the manifold plate contain the liquid coolant within the manifold plate (and perhaps other components of a fluid cooling system). The piercing element (or elements) on the cold plate may be inserted into the breakable seal (or seals) on the manifold plate to open the breakable seals and establish fluid communication between the cold and manifold plates. The use of a manifold plate including the breakable seals may enable the shipment and storage of a fluid cooling system precharged with a working fluid. Other embodiments are described and claimed.

31 Claims, 8 Drawing Sheets

U.S. PATENT DOCUMENTS

| | | |
|---|---|---|
| 2004/0190254 A1 | 9/2004 | Hu et al. |
| 2005/0039880 A1* | 2/2005 | Scott .......................... 165/80.2 |
| 2005/0081532 A1* | 4/2005 | Scott ............................ 62/3.2 |
| 2005/0103472 A1 | 5/2005 | Lofland et al. |
| 2005/0225938 A1 | 10/2005 | Montgomery et al. |
| 2006/0071326 A1* | 4/2006 | Chrysler et al. ............ 257/714 |
| 2006/0171117 A1* | 8/2006 | Hamman .................... 361/699 |
| 2006/0226539 A1 | 10/2006 | Chang |
| 2006/0262502 A1 | 11/2006 | Chang |

OTHER PUBLICATIONS

Pending, not yet published, U.S. Appl. No. 11/170,425, filed Jun. 29, 2006, to Crocker et al.

Pending, not yet published, U.S. Appl. No. 11/238,441, filed Jun. 29, 2006, to Kozyra, et al.

* cited by examiner

COLD PLATE AND MATING MANIFOLD PLATE FOR IC DEVICE COOLING SYSTEM ENABLING THE SHIPMENT OF COOLING SYSTEM PRE-CHARGED WITH LIQUID COOLANT

FIELD OF THE INVENTION

The disclosed embodiments relate generally to cooling systems for integrated circuit (IC) devices, and more particularly to a cold plate and mating manifold plate that enable the shipment of a cooling system pre-charged with a liquid coolant.

BACKGROUND OF THE INVENTION

The power dissipation of microprocessors and other processing devices generally increases with each design generation, as the operating frequencies of these devices are increased. At the same time, feature sizes are decreasing and, therefore, the number of active circuit elements (e.g., transistors) per unit area is rising, which may lead to increased power densities. This increase in power density coupled with higher operating frequencies can result in greater heat generation during operation of an IC die, and this heat should be dissipated for proper functioning of the die and reliability. Further, due to the aforementioned factors as well as other design and operating conditions, one or more "hot spots"—e.g., a location on a die where the temperature is significantly greater than in surrounding regions on the die—may be present on an IC die during operation, and a failure to adequately extract heat from such hot spots may lead to damage and/or a degradation in performance of the die. Thus, the thermal performance of die cooling systems in present and future generations of IC devices will become increasingly critical.

One technology that may meet the aforementioned needs is liquid cooling. Liquid cooling solutions may be used to cool a variety of IC devices, including processing devices such as microprocessors, field programmable gate arrays (FPGAs), application specific integrated circuits (ASICs), and any other type of IC device. Further, these liquid cooling systems may find application in numerous types of computing systems, including, for example, servers, desktop computers, laptop computers, as well as handheld and other portable computing devices. One challenge facing IC device manufacturers and computer system manufacturers alike is the handling of liquid coolants. Potential issues include the storage and shipment of IC devices and/or cooling systems with a liquid coolant, as well as the assembly of a computer including a liquid cooling system. The import of these issues may be most pronounced with regard to small equipment manufacturers who may not have the resources to purchase and/or operate their own liquid coolant filling systems.

DETAILED DESCRIPTION OF THE INVENTION

Figures 1A, 1B, 1C:
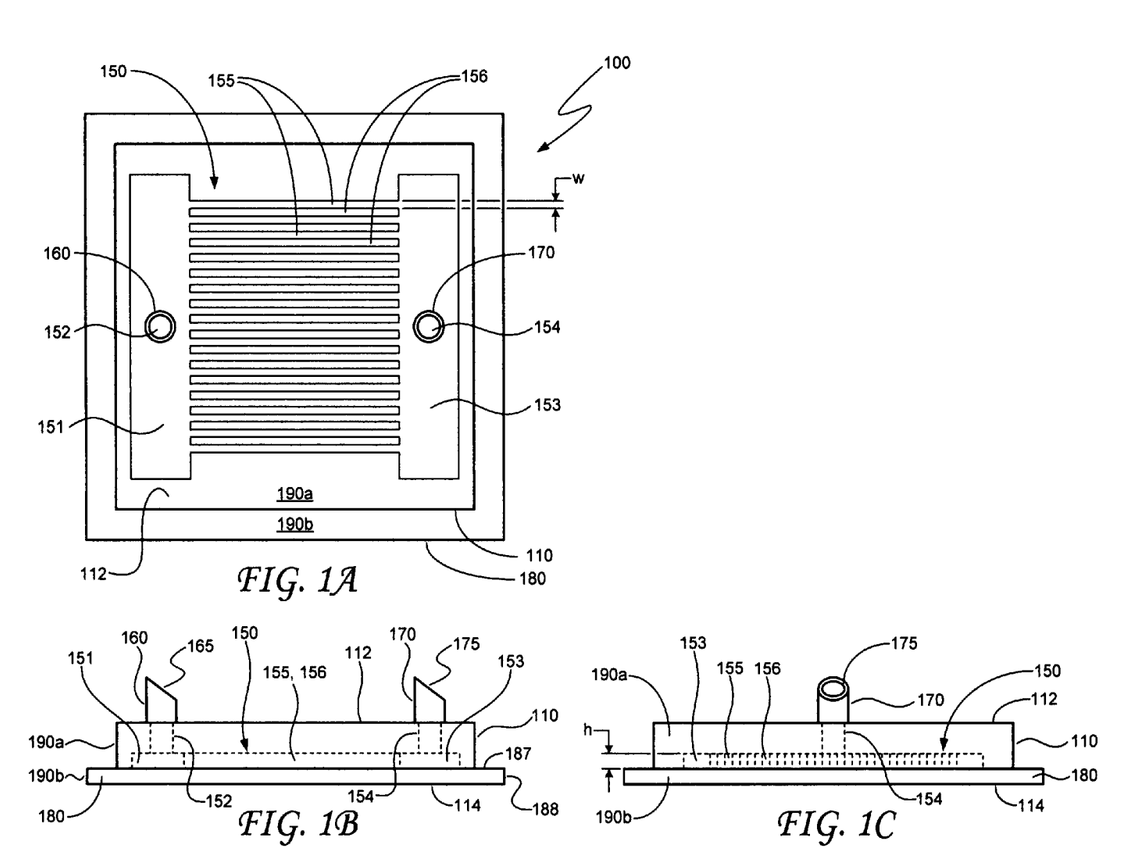
FIG. 1A is a schematic diagram showing a plan view an embodiment of a cold plate for a liquid cooling system.
FIG. 1B is a schematic diagram showing a front elevation view of the cold plate of FIG. 1A.
FIG. 1C is a schematic diagram showing a side elevation view of the cold plate of FIG. 1A.

Referring to FIGS. 1A through 1C, illustrated is an embodiment of a cold plate 100, which may form part of a cooling system for an integrated circuit (IC) device. In one embodiment, for example, an IC die is thermally coupled with the cold plate 100, and a liquid coolant flows through one or more channels on the cold plate to remove heat generated by the die. A plan view of the cold plate 100 is shown in FIG. 1A. A front elevation view of the cold plate 100 is shown in FIG. 1B, whereas a side elevation view of the cold plate is shown in FIG. 1C.

Cold plate 100 comprises a body 110 having an upper surface 112 and an opposing lower surface 114. Disposed in the body 110 is a flow path 150, and this flow path may comprise any combination of channels, plenums, ports, and other flow control devices or elements (e.g., pipes, conduits, valves, gates, etc.) in which a liquid coolant may pass. An IC die may be thermally coupled to the lower surface 114 of body 110 (see FIG. 2, which will be discussed below), and a liquid coolant circulating through the flow path 150 can remove heat generated by the die (and transferred to the cold plate 100 by, for example, conduction).

According to one embodiment, as shown in the figures, the flow path 150 comprises an inlet plenum 151 and an outlet plenum 153. The inlet plenum 151 is in fluid communication with an inlet port 152 and, similarly, the outlet plenum 153 is coupled with an outlet port 154. Extending between the inlet and outlet plenums 151, 153 are one or more channels 155, with adjacent channels 155 being separated by a wall 156 (it should be noted that in FIG. 1A the flow path 150 is shown in solid—rather than hidden—lines for clarity and ease of illustration). A liquid coolant may be introduced into the flow path 150 at the inlet port 152, and liquid coolant entering the inlet port flows into the inlet plenum 151. Liquid coolant in inlet plenum 151 can enter the channels 155 and flow toward the outlet plenum 153. As the liquid coolant traverses the channels 155, heat present in the body 110 (e.g., heat conducted into the body from an IC die) is transferred to the liquid coolant. The heated liquid coolant present in the outlet plenum 153 will then exit the flow path 150 at the outlet port 154. In one embodiment, this heated coolant is circulated through a heat exchanger (or other thermal device) to cool the liquid coolant, and this cooled liquid can be reintroduced into the flow path 150 at inlet port 152.

The flow path 150 may have any suitable structure, and it should be understood that the embodiment shown in FIGS. 1A-1C represents but one example of a flow path that may be disposed on the cold plate 100. Generally, the flow path 150 may have any suitable form which allows for the removal of heat from the cold plate by a liquid coolant. In addition, it should be noted that the pattern of channels 155 shown in FIGS. 1A-1C is just one example of the layout of channels that may find application with the disclosed embodiments, and the reader will appreciate that any suitable number and pattern of channels may be employed in the flow path 150. Also, the channels 155 may have any suitable dimensions, and in one embodiment each of the channels has a width (w) of between 50 µm and 200 µm and a height (h) of between 100 µm and 2,000 µm (channels of such dimensions sometimes referred to as "microchannels").

Coupled with the inlet port 152 of flow path 150 is a first piercing element 160 and, similarly, coupled with the outlet port 154 is a second piercing element 170. As will be described in more detail below, the cold plate 100 may be coupled with a manifold plate (or other thermal component or collection of components) containing a volume of a liquid coolant, and this manifold plate may contain one or more breakable seals to contain the coolant within the manifold plate prior to assembly (e.g., during shipping, handling, storage, etc.). Each of the piercing elements 160, 170 comprises any device capable of piercing or otherwise opening a breakable seal on the manifold plate. Although two piercing elements 160, 170 are shown in the illustrated embodiment, it should be understood that the cold plate 100 may include any suitable number of piercing elements (e.g., one, or more than two, etc.).

According to one embodiment, as shown in the figures, the piercing element 160 comprises a tube or other conduit extending from the inlet port 152, and an opposing end 165 of this tube is cut or formed at an angle. Similarly, the piercing element 170 may comprise a tube or other conduit extending from the outlet port 154, wherein an opposing end 175 of this tube has been cut or formed at an angle. The angled profile at each of the opposing ends 165, 175 of the piercing elements 160, 170, respectively, assists in puncturing a membrane or other breakable seal disposed on the manifold plate, as will be described below in more detail. It should, of course, be understood that the piercing elements 160, 170 are presented by way of example and not limitation and, further, that the piercing elements may have any suitable shape and configuration and, further, that the piercing elements may comprise other suitable devices.

In a further embodiment, the cold plate 100 further includes a retaining element 180. The retaining element 180 may comprise any feature or structure adapted to engage a socket or other retention mechanism (e.g., a socket and/or retention mechanism disposed on a motherboard). In one embodiment, as shown in the figures, the retaining element 180 comprises a lip extending around a periphery of the body 110. The lip includes surfaces 187, 188 that may, in some embodiments, engage a socket and/or retention mechanism.

The cold plate 100 may be manufactured using any suitable method or combination of methods. Fabrication processes that may be employed to make the cold plate, either alone or in combination, include etching, skiving, machining (e.g., milling, laser machining, etc.), molding, and/or stamping, as well as others. In one embodiment, the body 110 comprises an upper portion 190a and a lower portion 190b. The flow path 150 may be formed in the upper portion 190a (e.g., as by etching, skiving, molding, stamping, etc.), and then the lower portion 190b—which may comprise a generally flat plate—is attached to the upper portion (e.g., as by brazing, soldering, epoxy, etc.) to enclose the fluid plenums 151, 153 and channels 155. In another embodiment, the flow path 150 may be formed in the lower portion 190b, and in yet a further embodiment portions of the flow path may be formed in the upper portion 190a and other portions of the flow path formed in the lower portion 190b. The lower portion 190b of the body 110 may have dimensions larger than that of the upper portion 190a, such that an outer periphery of the lower portion extends beyond the periphery of the upper portion and functions as the retaining element 180. Further, the piercing elements 160, 170 may be formed integral with the body 110 or, alternatively, the piercing elements may comprise separate parts that are formed and subsequently attached to the body 110 (e.g., as by brazing, soldering, epoxy, etc.).

The cold plate 100 may comprise any suitable material or combination of materials. According to one embodiment, the cold plate includes a thermally conductive material, such as a metal (e.g., copper, aluminum, steel, and alloys of these and/or other metals), a polymer, or a composite material, as well as combinations of these and/or other materials. The piercing elements 160, 170 may also comprise any suitable material or combination of materials, including metals (e.g., copper, aluminum, brass, steel, etc.), polymers, and composite materials. In one embodiment, the piercing elements are formed from the same material as the body 110 of the cold plate (e.g., copper).

At this juncture, it should be noted that the term "cold plate" is used without limitation. Other thermal components, whether or not they exhibit the same functionality, may find application to the disclosed embodiments. Further, as the reader will appreciate, a thermal component providing functionality similar to that of the cold plate 100 may be referred to using alternative terminology. By way of example, thermal components that may find use with the disclosed embodiments include heat spreaders (a component sometimes referred to as an integrated heat spreader, or IHS) and heat sinks, and such thermal components may have functionality that is similar to that of cold plate 100 or that is different (at least in part) from that of the cold plate 100.

Figure 2:
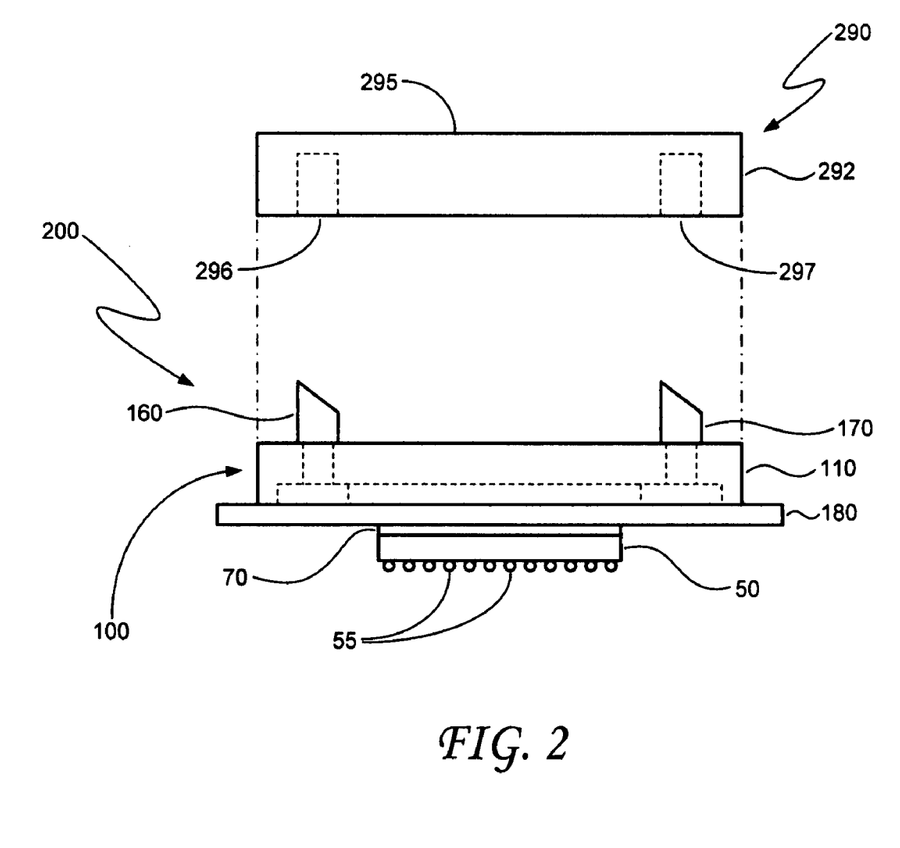
FIG. 2 is an elevation view illustrating the cold plate of FIGS. 1A-1C in combination with an IC die, as well as an embodiment of a cover for the cold plate.

Referring now to FIG. 2, illustrated is an embodiment of an assembly 200. The assembly 200 includes a cold plate, and in one embodiment the cold plate comprises the cold plate 100 of FIGS. 1A-1C. Coupled with the cold plate 100 is an IC die 50, and a thermal interface material (TIM) layer 70 may be disposed between the die 50 and cold plate 100 to both thermally and mechanically couple the cold plate and die. The IC die 50 may comprise any type of integrated circuit device, such as a microprocessor, a field programmable gate array (FPGA), application specific integrated circuit (ASIC), a graphics processor, or other processing device. A number of interconnects 55 (e.g., electrically conductive bumps or columns, bond wires, etc.) may extend from the processing device 50. The TIM layer 70 may comprise any suitable thermally conductive material. By way of example, TIM layer 70 may comprise a solder material or a thermally conductive polymer. In another embodiment, the cold plate 100 may be coupled with a heat spreader (perhaps with a TIM layer disposed between these two components), wherein the heat spreader is, in turn, coupled with an IC die.

In yet another embodiment, a cover 290 may be disposed over the cold plate 100 to protect the piercing elements 160, 170. The cover 290 may be disposed on the cold plate 100 (either by itself or as part of the assembly 200) to protect the cold plate during shipping, handling, and/or storage. The cover 290 may also prevent contaminates (e.g., particulates) from entering the flow path 150 of the cold plate 100. According to one embodiment, the cover comprises a body 292 having cavities 296, 297 sized and oriented to receive the piercing elements 160, 170, respectively, in order to protect these structures. The cover 290 may also include an upper surface 295 adapted to be picked up by fabrication and handling equipment (e.g., a pick-and-place head). The cover 290 may be constructed from any suitable material (e.g., plastics, composites, or metals) using any suitable fabrication technique (e.g., molding, machining, etc.).

Figure 3A:
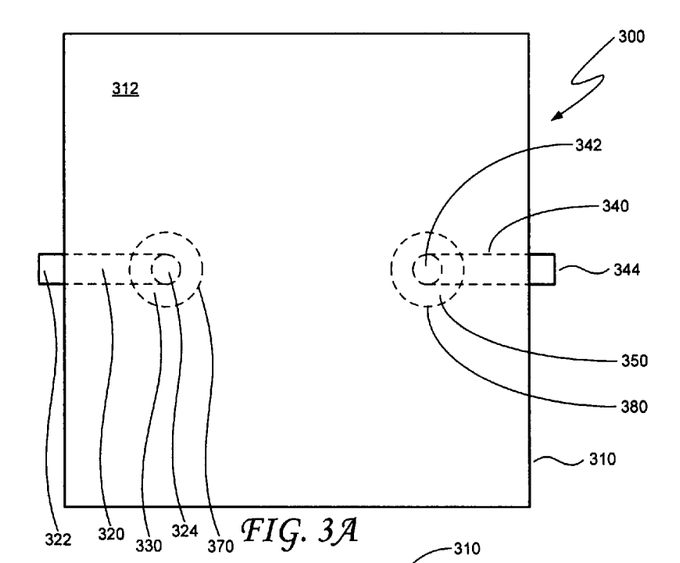
FIG. 3A is a schematic diagram showing a plan view an embodiment of a manifold plate for a liquid cooling system.
Figure 3B:
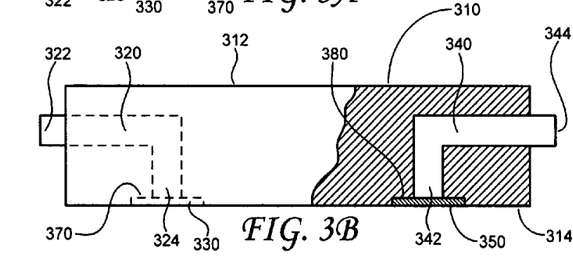
FIG. 3B is a schematic diagram showing a front elevation view of the manifold plate of FIG. 3A (shown in partial cross-section).
Figure 3C:
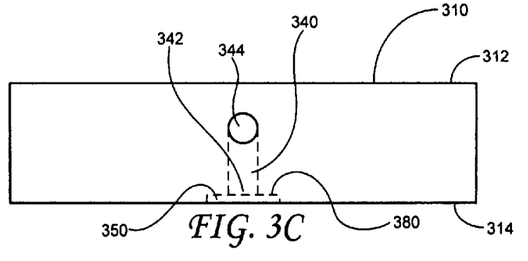
FIG. 3C is a schematic diagram showing a side elevation view of the manifold plate of FIG. 3A.

Illustrated in FIGS. 3A through 3C is an embodiment of a manifold plate 300, which may form part of a cooling system for an IC device. In one embodiment, for example, an IC die is thermally coupled with a cold plate (e.g., the cold plate 100 described above, or other thermal component), and the manifold plate is attached to the cold plate, such that fluid communication is established between the cold and manifold plates. A volume of liquid coolant may be disposed in the manifold plate 300 (or the manifold plate in combination with other components of a liquid cooling system), and when fluid communication is established with the cold plate the coolant may flow into a flow path of the cold plate. A plan view of the manifold plate 300 is shown in FIG. 3A, and a front elevation view of the manifold plate 300 is shown in FIG. 3B, with a side elevation view of the manifold plate being shown in FIG. 3C.

Referring to FIGS. 3A-3C, the manifold plate 300 comprises a body 310 having an upper surface 312 and an opposing lower surface 314. Disposed in the body 310 is a first fluid channel 320 and a second fluid channel 340. First fluid channel 320 includes an inlet 322 and an outlet 324, whereas second fluid channel 340 includes an inlet 342 and an outlet 344. Each of the inlet 322 of first fluid channel 320 and the outlet 344 of second fluid channel 340 may extend beyond the body 310 (e.g., each may include a tube extending from the body to allow for the coupling of other fluid lines to the manifold plate 300). Disposed at the outlet 324 of first fluid channel 320 is a first breakable seal 330. Similarly, disposed at the inlet 342 of second fluid channel 340 is a second breakable seal 350. Although two breakable seals 330, 350 are shown in the illustrated embodiments, it should be understood that the manifold plate 300 may have any suitable number of breakable seals (e.g., one, or more than two, etc.).

A volume of a liquid coolant (not shown in figures) may be disposed in each of the first and second fluid channels 320, 340 and retained therein by the breakable seals 330, 350, respectively. In one embodiment, the inlet 322 of first fluid channel 320 and the outlet 344 of second fluid channel 340 are coupled with other components of a liquid cooling system (e.g., a closed loop system), and this liquid cooling system may include an additional volume of the coolant. Alternatively, covers or seals may also be placed over the inlet 322 of first fluid channel 320 and the outlet 344 of second fluid channel 340 to aid in retaining the coolant within the first and second fluid channels 320, 340. Thus, the manifold plate 300 may contain a liquid coolant for an IC device cooling system, and the manifold plate—either alone or in combination with other components of the cooling system—may be stored, handled, and/or shipped with this liquid coolant. Further, the manifold plate 300 may be coupled with a cold plate (e.g., the cold plate 100 described above) or a die and cold plate assembly (e.g., the assembly 200 described above), and the liquid coolant stored in the manifold plate (and perhaps other system components) may serve as the working fluid in a liquid cooling system for an IC die, as will be described in more detail below. For the embodiments described below, it is assumed that the manifold plate 300 is coupled with the cold plate 100 of FIGS. 1A-1C; however, it should be understood that the disclosed manifold plate may be used with other types of cold plates or thermal components.

When the manifold plate 300 is coupled with the cold plate 100 (or cold plate and die assembly 200), the piercing elements 160, 170 will puncture or otherwise open the breakable seals 330, 350, respectively, on the manifold plate 300, thereby establishing fluid communication between the cold and manifold plates. Therefore, in general, the breakable seals 330, 350 may each comprise any device or structure capable of maintaining a fluid seal (and retaining fluid within the manifold plate) and, further, capable of being opened by the piercing elements 160, 170 of cold plate 100.

In one embodiment, each of the breakable seals comprises a membrane capable of being punctured by one of the piercing elements 160, 170. The membrane may comprise any suitable material, including a polymer or a metal. Suitable polymers include fluorinated ethylene propylene (FEP), polychlorotriflouroethylene (PCTFE), as well as polymers suitable for blister pack technology, whereas suitable metals may include aluminum, copper, and alloys of these and/or other metals. According to one embodiment, this membrane is ruptured by one of the piercing elements, but the piercing element does not completely sever the ruptured portion of the membrane away from the remainder of the membrane body, which prevents a piece of the membrane from breaking away and entering the fluid path of either the cold or manifold plates (or other components of a fluid cooling system). By way of example, as the manifold plate 300 engages the cold plate 100, the opening in the breakable seals 330, 350 may follow the circular contour of the piercing elements 160, 170, the ends of which may be cut at an angle, as described above. As insertion of the piercing elements 160, 170 into the breakable seals 330, 350 continues, the piercing elements may peel the breakable seals out of the way, but do not separate the cut portions away from the remainder of the seals (e.g., a circular chad remains attached to each breakable seal and this chad may be bent upwards and out of the flow region). The angled profile at the end of each piercing element 160, 170 (which may be similar to a hypodermic needle) may aid in the cutting and peeling action of the breakable seals 330, 350.

In one embodiment, as shown in FIGS. 3A-3C, the first breakable seal 330 is disposed in a recess 370 formed at the outlet 324 of the first fluid channel 320, and the second breakable seal 350 is disposed in a recess 380 formed at the inlet 342 of the second fluid channel 340. Thus, in the embodiment of FIGS. 3A-3C, the breakable seals 330, 350 are generally flush with the lower surface 314 of body 310. The breakable seals 330, 350 may be secured in the recesses 370, 380, respectively, by any suitable process (e.g., by adhesive bonding, by an interference fit, etc.).

Figure 3D:
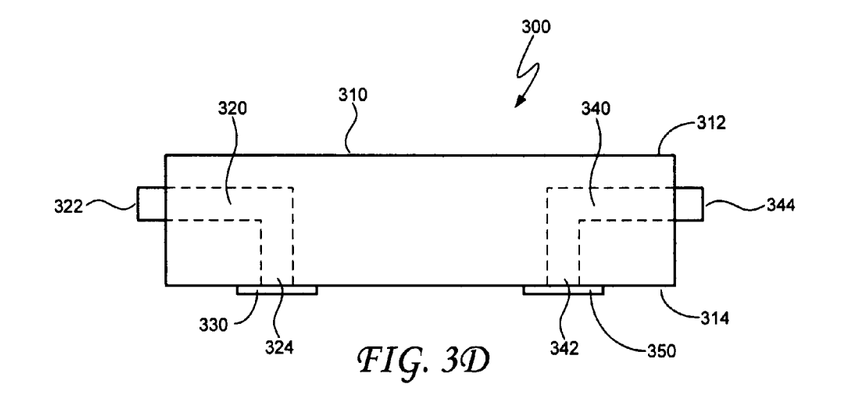
FIG. 3D is a schematic diagram illustrating an embodiment of a breakable seal for the manifold plate of FIGS. 3A-3C.

According to another embodiment, as shown in FIG. 3D, the breakable seals 330, 350 (e.g., membranes) are disposed on the lower surface 314 of the body 310. In the embodiment of FIG. 3D, the breakable seals 330, 350 may be secured to the surface 314 of the manifold plate using any suitable process (e.g., by adhesive bonding, etc.).

Figure 3E:
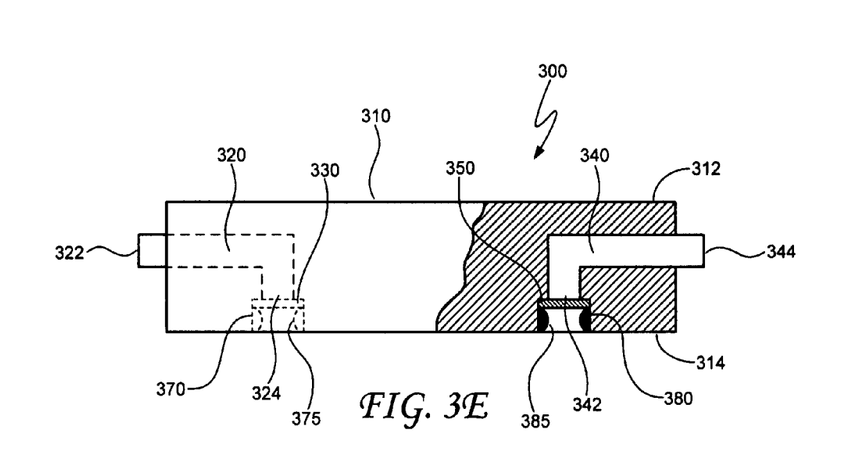
FIG. 3E is a schematic diagram illustrating another embodiment of a breakable seal for the manifold plate of FIGS. 3A-3C (shown in partial cross-section).

In a further embodiment, as illustrated in FIG. 3E, the breakable seals 330, 350 provide a "make-before-break" functionality. In the embodiment of FIG. 3E, each of the breakable seals 330, 350 is disposed in a recess 370, 380, respectively. In addition, a pre-seal element 375 is disposed in the recess 370 adjacent the membrane 330 (or other breakable seal) and, similarly, a pre-seal element 385 is disposed in the recess 380 adjacent the membrane 350. During insertion of the piercing elements 160, 170 of cold plate 100 into the recesses 370, 380, respectively, a seal is formed between the piercing elements and the pre-seal elements 375, 385 prior to opening of the membranes 330, 350. This seal (which may be temporary) can prevent the leakage of liquid coolant during the breaking (e.g., peeling back) of the membranes 330, 350 before full engagement between the manifold and cold plates is achieved. The pre-seal elements 375, 385 may each comprise any device or structure capable of forming a seal with the piercing elements 160, 170 on the cold plate, and these pre-seal elements may be fabricated from any suitable material. In one embodiment, each of the pre-seal elements 375, 385 comprises an O-ring or grommet fabricated from a polymer material (e.g., a soft rubber) or other suitable material or combination of materials. Also, in one embodiment, the depth of the recesses 370, 380 in FIG. 3E is sufficient to provide for the full engagement between the pre-seal elements 370, 380 and a periphery of the piercing elements 160, 170, respectively, prior to engagement between the piercing elements and the breakable seals 330, 350. Each of the breakable seals 330, 350 and the pre-seal elements 375, 385 may be secured within the recesses 370, 380, respectively, using any suitable process (e.g., by adhesive bonding, by an interference fit, etc.).

The manifold plate 300 may be fabricated using any suitable process or combination of processes. For example, molding, stamping, and/or machining (e.g., milling, laser machining, etc.) may be employed to fabricate the manifold plate. Also, the manifold plate 300 may comprise any suitable material or combination of materials. Materials believed suitable for fabrication of the manifold plate include, for example, metals (e.g., copper, aluminum, steel, brass, etc.), polymers, and composite materials, or combinations thereof. In one embodiment, the manifold plate 300 is formed, at least in part, from the same material used to construct the body 110 of cold plate 100 (e.g., copper). However, in other embodiments, the manifold plate 300 and cold plate 100 comprise different materials.

Figure 4:
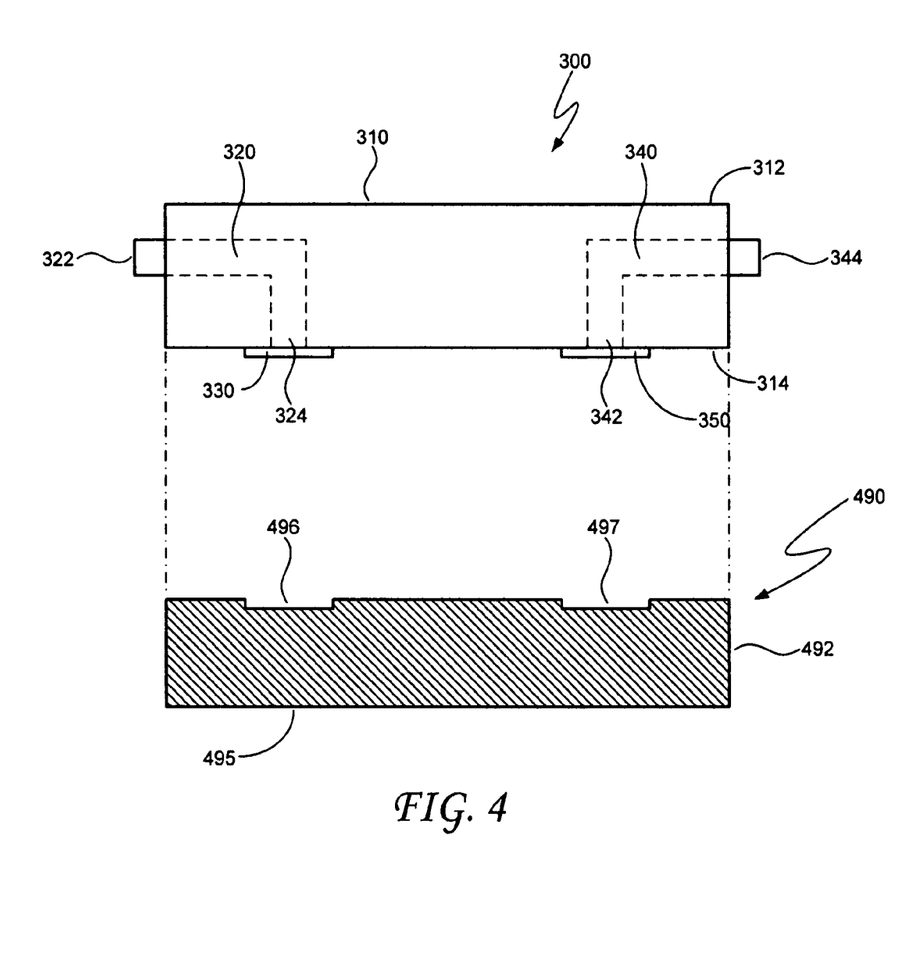
FIG. 4 is a schematic diagram illustrating an embodiment of a cover for the manifold plate of FIGS. 3A-3C (with the cover shown in cross-section).

Turning to FIG. 4, in a further embodiment, a cover 490 may be disposed over the manifold plate 300 to protect the breakable seals 330, 350. The cover 490 may be disposed on the manifold plate 300 (either by itself or as part of a larger assembly) to protect the manifold plate during shipping, handling, and/or storage. The cover 490 may also prevent contaminates from contacting and/or lodging on the breakable seals. In one embodiment, the cover 490 comprises a body 492 having cavities 496, 497 sized and oriented to receive the breakable seals 330, 350, respectively, in order to protect these structures. Where the breakable seals 330, 350 are disposed in recesses (e.g., the recesses 370, 380 of either FIG. 3B or 3E), the cover 490 may be configured to rest against the breakable seals in order to protect these devices from inadvertent rupture or other damage. The cover 490 may also include a lower surface 495 adapted to be picked up by fabrication and handling equipment (e.g., a pick-and-place head). The cover 490 may be constructed from any suitable material (e.g., plastics, composites, or metals) using any suitable fabrication technique (e.g., molding, machining, etc.).

At this point, it should be noted that the term "manifold plate" is used without limitation. Other fluid system components, whether or not they exhibit the same functionality as the above-described manifold plate 300, may find application to the disclosed embodiments. Further, as the reader will appreciate, a fluid system component providing functionality similar to that of the manifold plate 300 may be referred to using alternative terminology. By way of example, components that may find use with the disclosed embodiments include headers or header plates, fluid couplings, etc., and such components may have functionality that is similar to that of manifold plate 300 or that is different (at least in part) from that of the manifold plate 300.

Figure 5:
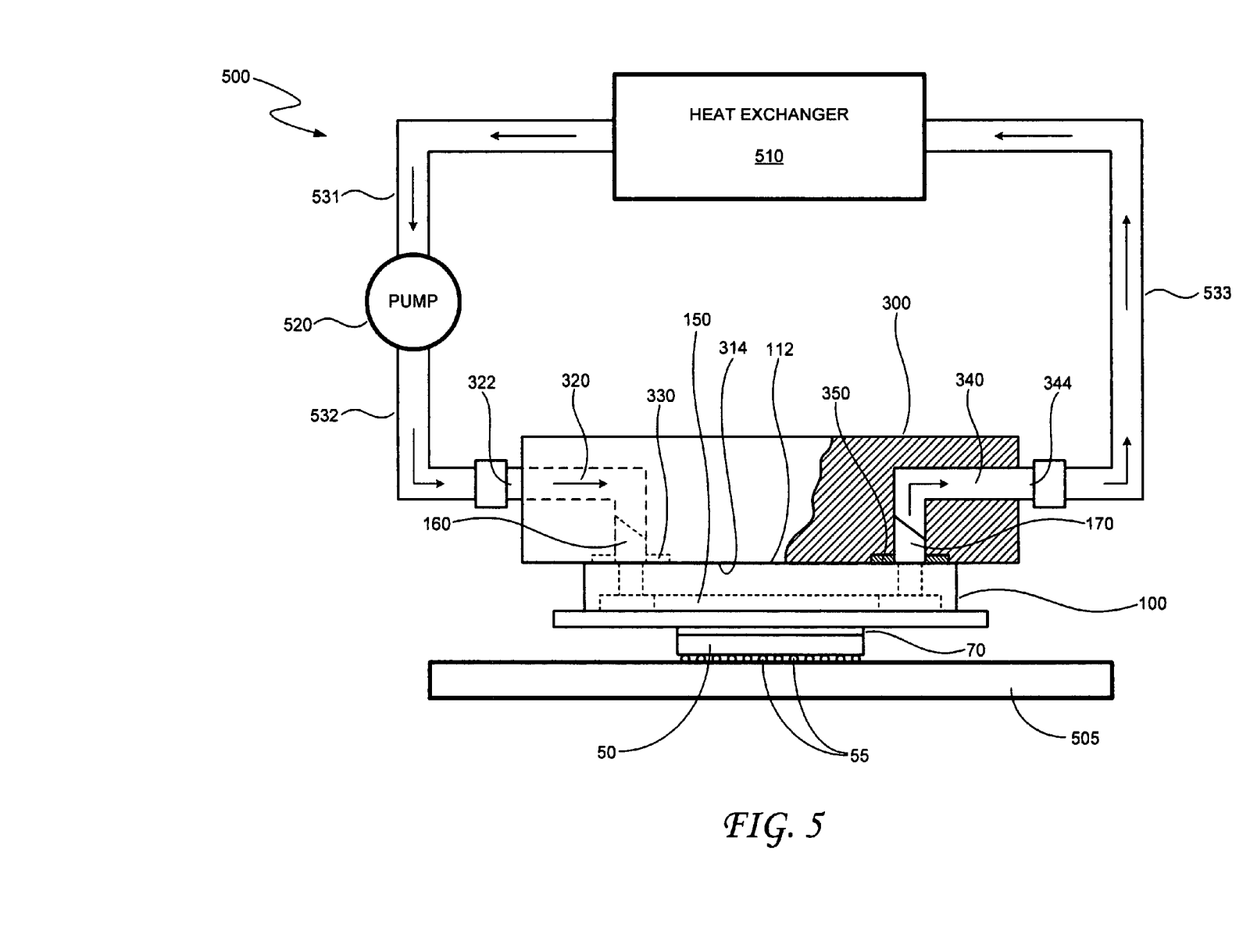
FIG. 5 is a schematic diagram illustrating an embodiment of an assembly including the cold plate of FIGS. 1A-1C and the manifold plate of FIGS. 3A-3C.

Turning now to FIG. 5, illustrated is an embodiment of an assembly 500. The assembly 500 may include the cold plate 100 and manifold plate 300 described above, as well as other components, to form a fluid cooling system of an integrated circuit (IC) die 50. The assembly 500 may form part of any type of computer system, such as, for example, a server, a desktop computer, or a laptop computer, as well as a handheld or other portable computing device.

The assembly 500 includes the cold plate 100, as noted above, and an IC die 50 is coupled with the cold plate. A TIM layer 70 may be disposed between the cold plate and die to both thermally and mechanically couple these two parts, and this TIM layer may comprise any suitable thermally conductive material (e.g., a metal, such as a solder, or a thermally conductive polymer, etc.). A number of interconnects 55 (e.g., electrically conductive bumps or columns, wire bonds, etc.) extend from the die 50, and these interconnects may be electrically coupled with corresponding lands or other leads (not shown) on a substrate 505. To aid in mechanically securing the die 50 to substrate 505, a layer of underfill material or a die attach material (not shown) may be disposed between the die and substrate. The substrate 505 may have any suitable construction, and in one embodiment the substrate 505 comprises a multilayer substrate having several layers of metallization for routing electrical signals. Further, in one embodiment, a number of interconnects (not shown) may be disposed on a lower surface of the substrate 505 opposite the die side, and these interconnects (e.g., electrically conductive bumps or columns, pins, etc.) may be used to coupled the assembly 500 to a next-level component (e.g., a motherboard, etc.). In one embodiment, however, the substrate 505 comprises a motherboard.

The assembly 500 further includes the manifold plate 300, as previously noted, and the manifold plate is secured to the cold plate 100, such that fluid communication is established between these two components. To establish fluid communication, the piercing elements 160, 170 of cold plate 100 are inserted into the breakable seals 330, 350, respectively, of manifold plate 300, and the piercing elements open the breakable seals, as described above. In FIG. 5, the manifold plate 300 is shown fully engaged with the cold plate 100, wherein the lower surface 314 of the manifold plate is resting against (or at least in close proximity to) the upper surface 112 of the cold plate 100, and the piercing elements 160, 170 have opened the breakable seals 330, 350 and are fully inserted into the fluid channels 320, 340, respectively, on the manifold plate.

The assembly 500 may further include a heat exchanger 510 and a pump 520. A first fluid line 531 may couple an outlet of the heat exchanger 510 to an inlet of the pump 520, and a second fluid line 532 may couple an outlet of the pump 520 to the inlet 322 on the manifold plate 300. A third fluid line 533 may couple the outlet 344 on the manifold plate 300 to an inlet of the heat exchanger 510. Heat exchanger 510 may comprise any suitable type of heat exchanger, and may include a passive device (e.g., a multi-fin heat sink) and/or an active cooling device (e.g., a fan). The pump 520 may comprise any suitable type of pump for circulating a fluid, such as a centrifugal pump, a gear pump, a diaphragm pump, a turbine, etc. Fluid lines 531, 532, 533 may comprise any suitable type of conduit for containing the flow of a fluid (e.g., pipes, flexible tubing, etc.). According to one embodiment, the heat exchanger 510 may be coupled with the manifold plate 300. In another embodiment, the heat exchanger 510 and pump 520 (and perhaps any one or more of fluid lines 531, 532, 533) may be disposed on or coupled with the substrate 505 or a next-level component, such as a motherboard.

The cold plate 100, manifold plate 300, heat exchanger 510, pump 520, and fluid lines 531, 532, 533 provide a fluid cooling system for the IC die 50. This fluid cooling system may be single phase or two phase, and may utilize any suitable type of working fluid, such as water, propylene glycol, ethylene glycol, potassium formate, or a hydrocarbon based fluid, as well as a mixture of these and/or other substances (e.g., a mixture of water and propylene glycol). Further, the flow path 150 on cold plate 100, the first and second fluid channels 320, 340 of manifold plate 300, the heat exchanger 510, the pump 520, as well as the first, second, and third fluid lines 531, 532, 533 collectively define a fluid circuit (e.g., a closed-loop circuit) in which a liquid coolant may be circulated to cool the integrated circuit die 50. This fluid circuit may include a volume of the liquid coolant prior to engagement between the cold plate 100 and manifold plate 300, and the liquid coolant may be retained in the cooling system by the breakable seals 330, 350. Thus, the cooling system (without the cold plate 100) could be shipped (and/or stored, handled, etc.) precharged with an appropriate volume of the liquid coolant for operation of the cooling system. Note that the volume of the flow path 150 in cold plate 100 may be relatively small in comparison to the volume of the remaining portion of the fluid circuit and, therefore, the cold plate (either by itself or in combination with the IC die 50) could be shipped dry and subsequently assembled with the manifold plate 300 without concern for the small amount of gas that it may introduce into the fluid circuit. It should also be understood that the above-described fluid cooling system may include other components in addition to those shown in FIG. 5 (e.g., filters, sensors, valves, etc.) and, further, that such a cooling system may not include all of the components illustrated in FIG. 5.

Figure 6:
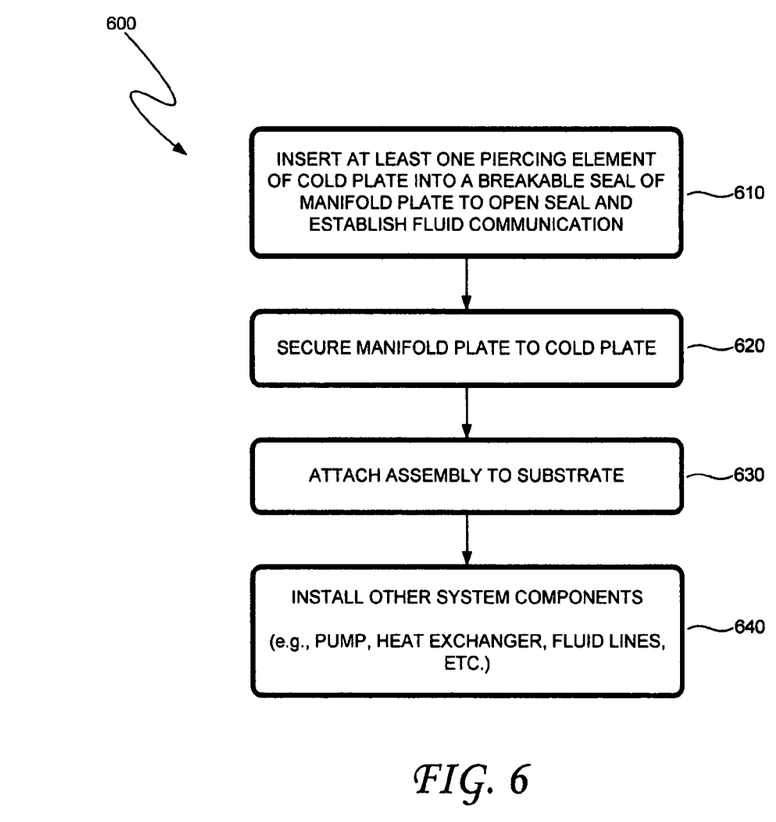
FIG. 6 is a block diagram illustrating an embodiment of a method for assembling a liquid cooling system for an IC device.

Referring to FIG. 6, illustrated is an embodiment of a method 600 for assembling a liquid cooling system for an IC die. Referring to block 610 in this figure, at least one piercing element on a cold plate (or other thermal component) is inserted into a corresponding breakable seal on a manifold plate (or other component of a fluid system) in order to establish fluid communication between the cold and manifold plates, as described above. An IC die may be thermally coupled with the cold plate. As set forth in block 620, the manifold plate is secured to the cold plate. In one embodiment, the engagement between the piercing element (or elements) and the breakable seal (or seals) secures the cold and manifold plates together. However, in other embodiments, alternative techniques may be employed to secure these two components to one another (e.g., adhesive bonding, mechanical fasteners, etc.). In a further embodiment, as set forth in block 630, the cold and manifold plate assembly, which may include an IC die (and perhaps other components of a fluid cooling system), is attached to a substrate. For example, a number of interconnects extending from the die may be electrically coupled to corresponding lands or leads on the substrate and, in addition, an underfill or die attach material may be disposed between the die and substrate. In a further embodiment, a die may be secured to a substrate prior to attachment of the die to the cold plate (in which case, element 630 may be unnecessary). According to one embodiment, other components of a fluid cooling system (for the IC die) are coupled with the manifold plate prior to assembly with the cold plate. However, referring to block 640, in another embodiment, one or more additional components of a cooling system (e.g., a pump, heat exchanger, fluid lines, etc.) are then coupled with the manifold plate.

Figure 7:
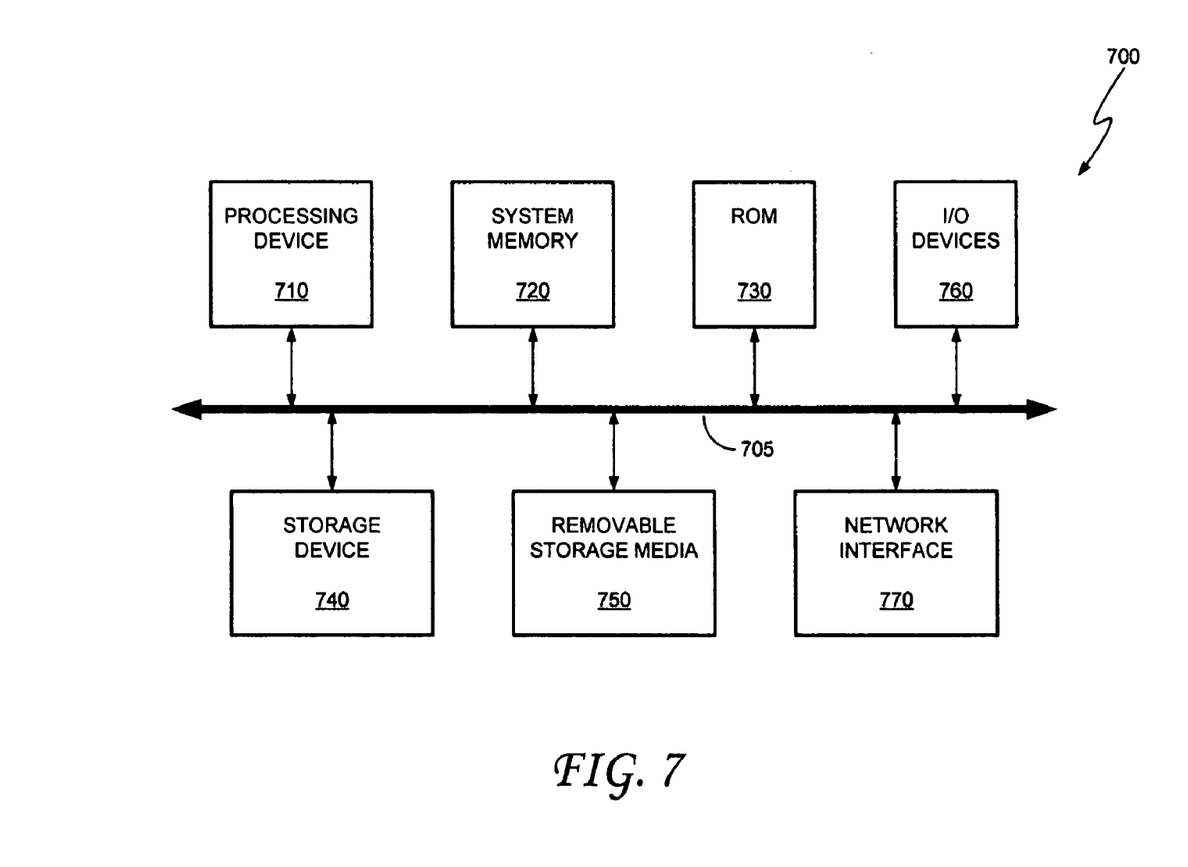
FIG. 7 is a schematic diagram illustrating an embodiment of a computing system, which may include any of the disclosed embodiments of a liquid cooling system.

Referring to FIG. 7, illustrated is an embodiment of a computer system 700. Computer system 700 includes a bus 705 to which various components are coupled. Bus 705 is intended to represent a collection of one or more buses—e.g., a system bus, a Peripheral Component Interface (PCI) bus, a Small Computer System Interface (SCSI) bus, etc.—that interconnect the components of system 700. Representation of these buses as a single bus 705 is provided for ease of understanding, and it should be understood that the system 700 is not so limited. Those of ordinary skill in the art will appreciate that the computer system 700 may have any suitable bus architecture and may include any number and combination of buses.

Coupled with bus 705 is a processing device (or devices) 710. The processing device 710 may comprise any suitable processing device or system, including a microprocessor (e.g., either a single core or a multi-core processor), a network processor, an application specific integrated circuit (ASIC), or a field programmable gate array (FPGA), or similar device. It should be understood that, although FIG. 7 shows a single processing device 710, the computer system 700 may include two or more processing devices.

Computer system 700 also includes system memory 720 coupled with bus 705, the system memory comprising, for example, any suitable type and number of memories, such as static random access memory (SRAM), dynamic random access memory (DRAM), synchronous DRAM (SDRAM), or double data rate DRAM (DDRDRAM). During operation of computer system 700, an operating system and other applications may be resident in the system memory 720.

The computer system 700 may further include a read-only memory (ROM) 730 coupled with the bus 705. The ROM 730 may store instructions for processing device 710. The system 700 may also include a storage device (or devices) 740 coupled with the bus 705. The storage device 740 comprises any suitable non-volatile memory, such as, for example, a hard disk drive. The operating system and other programs may be stored in the storage device 740. Further, a device 750 for accessing removable storage media (e.g., a floppy disk drive or a CD ROM drive) may be coupled with bus 705.

The computer system 700 may also include one or more I/O (Input/Output) devices 760 coupled with the bus 705. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 700.

The computer system 700 may further comprise a network interface 770 coupled with bus 705. The network interface 770 comprises any suitable hardware, software, or combination of hardware and software that is capable of coupling the system 700 with a network (e.g., a network interface card). The network interface 770 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 700 illustrated in FIG. 7 is intended to represent an exemplary embodiment of such a system and, further, that this system may include many additional components, which have been omitted for clarity and ease of understanding. By way of example, the system 700 may include a DMA (direct memory access) controller, a chip set associated with the processing device 710, additional memory (e.g., a cache memory), as well as additional signal lines and buses. Also, it should be understood that the computer system 700 may not include all of the components shown in FIG. 7. The computer system 700 may comprise any type of computing device, such as a desktop computer, a laptop computer, a server, a hand-held computing device (e.g., a personal digital assistant, or PDA), a wireless communication device, an entertainment system, etc.

In one embodiment, the computer system 700 includes a component constructed according to any of the embodiments described above. For example, the computer system 700 may include the cold plate 100 and manifold plate 300. In one embodiment, the computer system 700 includes the assembly 500 described above (in which case, the IC die 50 may comprise the processing device 710).

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A cold plate comprising:
   a body;
   a fluid path disposed in the body, the fluid path including a port; and
   a piercing element coupled with the port, and disposed on a surface of the body; the piercing element to open a breakable seal on a surface of a manifold plate.

2. The cold plate of claim 1, wherein the port comprises an inlet port, the thermal component further comprising:
   an outlet port disposed on the fluid path; and
   a second piercing element coupled with the outlet port, the second piercing element to open a second breakable seal on the manifold plate.

3. The cold plate of claim 2, wherein the fluid path further comprises a number of channels.

4. The cold plate of claim 3, wherein the fluid path further comprises:
   an inlet plenum coupled with one end of each of the channels and in fluid communication with the inlet port; and
   an outlet plenum coupled with an opposing end of each of the channels and in fluid communication with the outlet port.

5. The cold plate of claim 1, wherein the piercing element comprises a cylindrical tube having one end coupled with the port and an opposing end extending from the body, the opposing end having an angled profile.

6. The cold plate of claim 1, further comprising a retention element disposed on the body, the retention element to engage a socket or a retention mechanism.

7. The cold plate of claim 1, wherein the manifold plate includes a volume of a liquid coolant.

8. The cold plate of claim 1, wherein the piercing element is disposed on one surface of the body and an integrated circuit die is thermally coupled with an opposing surface of the body.

9. The cold plate of claim 1, wherein the piercing element is disposed on one surface of the body and a heat spreader is thermally coupled with an opposing surface of the body.

10. A manifold plate comprising:
    a body;
    a fluid channel disposed in the body and including a port on a surface of the body; and
    a breakable seal disposed at the port, the breakable seal to be opened upon engagement with a piercing element on a body of a cold plate.

11. The manifold plate of claim 10, wherein the port comprises an outlet port, the component further comprising:
    an inlet port disposed on the fluid channel, the fluid channel extending between the inlet port and outlet port;
    a second fluid channel disposed in the body, the second fluid channel extending between a second inlet port and a second outlet port; and
    a second breakable seal disposed on the second inlet port, the second breakable seal to be opened upon engagement with a second piercing element of the cold plate.

12. The manifold plate of claim 10, wherein the breakable seal comprises a membrane disposed over the port.

13. The manifold plate of claim 12, further comprising a recess formed in the body and disposed at the port, wherein the membrane is disposed in the recess.

14. The manifold plate of claim 13, further comprising a pre-seal element disposed in the recess, the pre-seal element to engage the piercing element prior to engagement of the piercing element with the membrane.

15. The manifold plate of claim 12, wherein the membrane comprises a material selected from a group consisting of fluorinated ethylene propylene (FEP), polychlorotrifluoroethylene (PCTFE), aluminum, aluminum alloys, copper, and copper alloys.

16. The manifold plate of claim 10, further comprising a volume of a fluid coolant disposed in the fluid channel.

17. The manifold plate of claim 10, wherein a fluid cooling system is in fluid communication with the fluid channel, the fluid cooling system including a pump and a heat exchanger.

18. A method comprising:
providing a cold plate disposed on a surface of a body having a piercing element, and thermal component coupled with an integrated circuit die;
providing a fluid system component having a breakable seal, the fluid system component containing a volume of a fluid coolant; and
inserting the piercing element into the breakable seal to open the breakable seal and establish fluid communication between the thermal and fluid system components.

19. The method of claim 18, further comprising securing the cold plate to the fluid system component.

20. The method of claim 19, wherein an engagement between the piercing element and the breakable seal secures the cold plate to the fluid system component.

21. The method of claim 18, wherein the cold plate includes a second piercing element and the fluid system component includes a second breakable seal, the method further comprising inserting the second piercing element into the second breakable seal to open the second breakable seal.

22. The method of claim 18, further comprising coupling the integrated circuit die to a substrate.

23. The method of claim 18, wherein the cold plate includes a fluid path disposed proximate the integrated circuit die and wherein flow of the fluid coolant through the fluid path removes heat generated by the die.

24. The method of claim 18, wherein the fluid system component is coupled with a fluid cooling system including a pump and a heat exchanger, and wherein the fluid cooling system includes an additional volume of the fluid coolant.

25. The method of claim 18, further comprising coupling at least one other component of a fluid cooling system with the fluid system component.

26. An assembly comprising:
a cold plate, the cold plate including a body having a fluid path, a first piercing element disposed on the body and coupled with the fluid path, and a second piercing element disposed on the body and coupled with the fluid path; and
a manifold plate secured to the cold plate, the manifold plate including a body, a first breakable seal disposed on the body, and a second breakable seal disposed on the body;
wherein the first and second piercing elements have opened the first and second breakable seals, respectively, to establish fluid communication between the manifold and cold plates.

27. The assembly of claim 26, wherein the manifold plate is secured to the cold plate by an engagement between the first piercing element and the first breakable seal and by an engagement between the second piercing element and the second breakable seal.

28. The assembly of claim 26, further comprising an integrated circuit die coupled with the cold plate.

29. The assembly of claim 28, further comprising a substrate coupled with the integrated circuit die.

30. The assembly of claim 26, further comprising:
a pump in fluid communication with a first fluid channel on the manifold plate, the first breakable seal disposed at an outlet of the first fluid channel; and
a heat exchanger in fluid communication with a second fluid channel on the manifold plate, the second breakable seal disposed at an inlet of the second fluid channel.

31. The assembly of claim 26, wherein the cold plate further comprises:
a number of channels disposed in the fluid path;
an inlet plenum coupled with one end of each of the channels and in fluid communication with an inlet port of the fluid path, the first piercing element disposed at the inlet port; and
an outlet plenum coupled with an opposing end of each of the channels and in fluid communication with an outlet port of the fluid path, the second piercing element disposed at the outlet port.

* * * * *